United States Patent

[11] 3,577,179

[72] Inventor Duval West
Houston, Tex.
[21] Appl. No. 847,860
[22] Filed Aug. 6, 1969
[45] Patented May 4, 1971
[73] Assignee Geo Space Corporation

[54] ACTIVE FILTER
12 Claims, 2 Drawing Figs.

[52] U.S. Cl. .......... 330/107, 330/109
[51] Int. Cl. .......... H03f 1/36
[50] Field of Search .......... 330/21, 28, 31, 107, 109, 176; 333/70 (R), 75

[56] References Cited

UNITED STATES PATENTS 2,584,386 2/1952 Hare .......... 330/176X
3,473,142 10/1969 Herrero et al. .......... 330/109X

OTHER REFERENCES

Farrer, " A Simple Active Filter with Independent Control Over the Pole and Zero Locations," Electronic Engineering, April 1967, pp. 219— 222, 330—31

Kerwin, " Synthesis of Active RC Networks Containing Distributed and Lumped Elements," Proceedings of the first Asilomar Conference on Circuits and Systems 1967, pp. 288— 298, 330–109

Moschytz et al., " Active Filters: Part 5, Applying the Operational Amplifier," Electronics, December 9, 1968, pp. 98— 106, 330–109

*Primary Examiner*—Roy Lake
*Assistant Examiner*—James B. Mullins
*Attorneys*—Michael P. Breston and Alfred B. Levine

ABSTRACT: This invention relates to an improved low-pass, active, elliptic-function filter. One state of the filter includes a twin-T, RC network having an input terminal, an output terminal and a feedback terminal. The output terminal is connected to ground through a capacitor; the input terminal is connected to ground through a capacitor; and the feedback terminal is connected to the output terminal of a noninverting amplifier having a gain greater than or equal to unity. The input terminal of the amplifier is connected to the output terminal of the twin-T network. The source of incoming signals is connected through a resistor to the input terminal of the twin-T network. The filter can be made to include two or more stages connected in tandem combination.

Duval West
INVENTOR

BY Michael P. Breston
ATTORNEY

ACTIVE FILTER

BACKGROUND OF THE INVENTION

In the processing of seismic signals, for example, it is desired that each amplifier in each low-pass filter stage have a gain nearly equal to unity. Unity gain is desired for the amplifier of each seismic low-pass filter stage because the incoming seismic signals have an extremely large dynamic amplitude range. Consequently, when using a unity-gain amplifier in each filter stage, the permissible amplitude of the incoming seismic signals without appreciable distortion can be as large as the permissible amplitude of the output signals.

SUMMARY OF THE INVENTION

An active, low-pass, elliptic-function filter is provided, Each stage of the filter includes an amplifier, having a gain nearly equal to unity, and a RC, twin-T network. A positive feedback path is provided between the amplifier and the twin-T network. A capacitor is coupled from the output terminal of the twin-T network to ground.

The source of signals to be transmitted through the filter is connected in series with a resistor to the input terminal of the twin-T network of the first stage. A capacitor is coupled from the input terminal of the twin-T network of the first stage to ground.

The filter stages are selected and connected in tandem combination so that the filter maintains a near-unity gain in its pass band and a very high rate of attenuation after its cutoff frequency.

The gain of the first filter stage is near unity at the beginning of its pass band and gradually decreases to its cutoff frequency. The gain of the second stage is near unity throughout its pass band, except that it exceeds unity prior to reaching its cutoff frequency. The gain of the third stage is near unity throughout its pass band, except that it exceeds unity prior to reaching its cutoff frequency.

In this manner, the resultant gain of the filter remains nearly equal to unity throughout its pass band, and the resultant gain has an extremely sharp rate of attenuation after its cutoff frequency in the transition band. The resultant gain remains highly attenuated in its stop band.

BRIEF DESCRIPTION OF THE DRAWINGS

In FIG. 1, the filter, generally designated as 9, includes an input filter stage which is generally designated as 10. Filter stage 10 has a transfer function with three poles and two zeros and includes a three terminal, twin-T, RC network 12 having an input terminal 14, an output terminal 16, and a feedback terminal 18. Coupled between the output terminal 16 and grounded terminal 20 is a capacitor 22. Coupled between input terminal 14 and ground 20 is a capacitor 24. The input terminal 26 of an amplifier 28 is connected to terminal 16. The output terminal 30 of amplifier 28 is connected to terminal 18 through a feedback path 32.

Figures 1, 2:
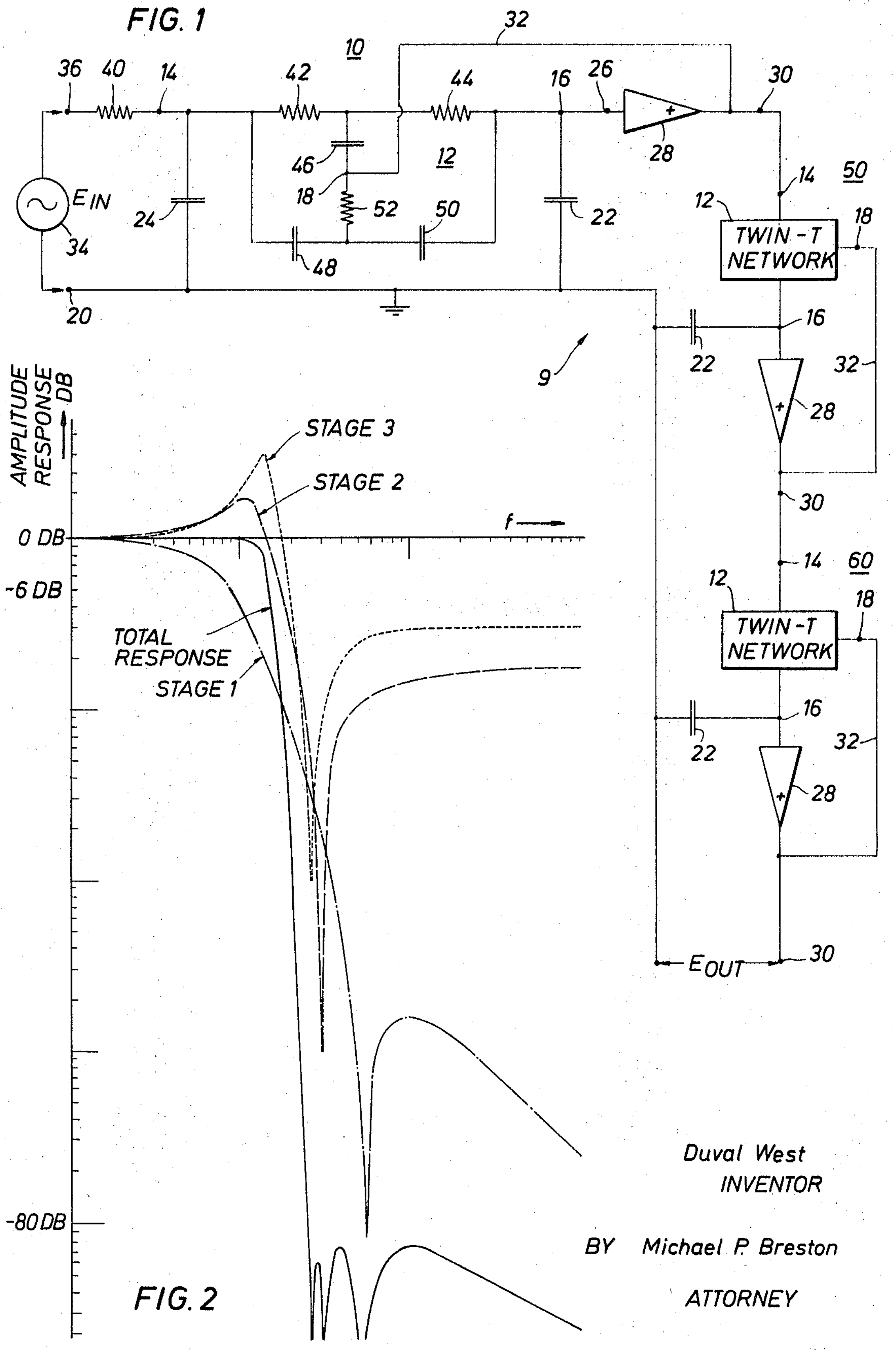
FIG. 1 shows a preferred embodiment of the filter in accordance with this invention.
FIG. 2 shows gain vs. frequency curves for the filter of FIG. 1.

Amplifier 28 has a gain near unity and is noninverting, i.e., the polarity of its output signal is the same as the polarity of its input signal. For some applications amplifier 28 may have a gain greater than unity. A source 34 of input signals is applied to input terminals 36 and 20 of filter stage 10. Connected between terminals 36 and 14 is a resistor 40. Twin-T network 12 includes resistors 42, 44, 52 and capacitors 46, 48, and 50, arranged as shown.

Filter stage 10 has three poles and two zeros. By suitably selecting the values of the RC circuit elements, the poles and zeros can be positioned to achieve desired gain versus frequency response curves. A particularly useful gain vs. frequency response curve can be obtained when filter 10 is used as the input stage of a tandem combination of a number of filter stages, where the number is preferably three.

Thus, a second filter stage 50 and a third filter stage 60 are connected in tandem combination with input stages 10. Stages 50 and 60 may be identical to each other except for the values of the RC circuit elements employed therein. Each of stages 50 and 60 preferably has two poles and two zeros. To facilitate the exposition and to indicate similarity, identical parts throughout the filter stages are assigned the same reference characters.

Each of stages 50 and 60 includes a twin-T, RC network 12, an amplifier 28, a capacitor 22 connected between output terminal 16 and ground 20, and a feedback path 32 between the output 30 of amplifier 28 and feedback terminal 18.

Referring to FIG. 2, in order to achieve a gain for combined filter 9 which is substantially flat and near-unity (0 db.), throughout its pass band, it is essential that the gain of the first filter stage 10 should not exceed unity throughout its pass band. The cutoff frequency (−3db. frequency) of stage 10 is significantly smaller than the cutoff frequencies of the second and third stages 50 and 60. The second stage 50 is provided near the end of its pass band (the band up to the cutoff frequency) with a peak gain appreciably greater than unity. The third stage 60 has a peak gain near the end of its pass band which is also appreciably greater than unity, and, preferably, greater than the peak gain of the second stage 50.

The resultant gain of the combined filter 9 (which is obtained by adding in db. the individual gains of filters 10, 50 and 60) has a relatively flat, near-unity gain throughout its entire pass band and an extremely sharp rate of attenuation from the pass band to the stop band.

In one embodiment with filter 9 having seven poles and six zeros, the attenuation in the stop band was on the order of 80 db., the transition band was one octave, and the ripple in the pass band was less than 0.1 db.

While specific curves and values have been described and illustrated it will be apparent to those skilled in the art that variations may be made therein without departing from the scope of the invention as defined in the claims appended hereto.

I claim:

1. A low-pass active filter, said filter including a first stage having three piles and two zeros comprising:
   - a twin-T network having an input terminal, an output terminal and a feedback terminal;
   - a first capacitor connected between said output terminals and ground;
   - a second capacitor connected between said input terminal and ground;
   - an amplifier having an input terminal and an output terminal;
   - means connecting the output terminal of said amplifier to said feedback terminal;
   - means connecting the input terminal of said amplifier to said output terminal of said network; and
   - a resistor having a first terminal and a second terminal,
   - said second terminal being connected to the input terminal of said network and said first terminal receiving the signal to be filtered.

2. The filter of claim 1 wherein said twin-T network includes resistors and capacitors.

3. The filter of claim 2 wherein said amplifier has a positive gain.

4. The filter of claim 1 and further including a second filter stage connected in tandem combination with said first filter stage, said second stage comprising:
   - a twin-T network having an input terminal, an output terminal and a feedback terminal;
   - an amplifier having an input terminal and an output terminal;
   - means connecting the output terminal of said amplifier to the feedback terminal of said network;
   - means connecting the output terminal of said network to the input terminal of said amplifier;
   - a capacitor connected between the output terminal of said network and ground; and means connecting the output terminal of the amplifier in said first filter stage to the input terminal of the twin-T network in said second filter stage.

5. The filter of claim 4 wherein the twin-T network in said second stage includes resistors and capacitors.

6. The filter of claim 5 wherein the amplifier in said second stage has a positive gain.

7. The filter of claim 6 and further including a third filter stage, said third stage comprising:

a twin-T network having an input terminals, an output terminal and a feedback terminal;

an amplifier having an input terminal and an output terminal;

means connecting the output terminal of said amplifier to the feedback terminal of said network;

means connecting the input terminal of said amplifier to the output terminal of said network;

a capacitor connected between the output terminal of said network and ground; and means connecting the output terminal of the amplifier in said second filter stage to the input terminal of the twin-T network in said third stage.

8. The filter of claim 7 wherein said twin-T network in said third stage includes resistors and capacitors.

9. The filter of claim 8 wherein the amplifier in said third stage has a positive gain.

10. The filter of claim 9 wherein each of said amplifiers is noninverting.

11. The filter of claim 10 wherein each of said second and third filter stages has two poles and two zeros.

12. The filter of claim 11 wherein the resultant gain versus frequency response has an attenuation greater than 70 db. in its stop band.